United States Patent [19]
Noda

[11] Patent Number: 5,195,054
[45] Date of Patent: Mar. 16, 1993

[54] SEMICONDUCTOR MEMORY
[75] Inventor: Masanori Noda, Kanagawa, Japan
[73] Assignee: Sony Corporation, Tokyo, Japan
[21] Appl. No.: 618,631
[22] Filed: Nov. 27, 1990
[30] Foreign Application Priority Data
Nov. 27, 1989 [JP] Japan ................... 1-306821
[51] Int. Cl.[5] ................... G11C 5/06; H01L 27/10
[52] U.S. Cl. ................... 365/63; 365/51
[58] Field of Search ................... 365/51, 63, 226
[56] References Cited
U.S. PATENT DOCUMENTS

| 4,193,125 | 3/1980 | Moriya | 365/104 |
|---|---|---|---|
| 4,281,397 | 7/1981 | Neal et al. | 365/185 |
| 4,384,349 | 5/1983 | McElroy | 365/218 |
| 4,493,057 | 1/1985 | McElroy | 365/51 X |
| 4,638,458 | 1/1987 | Itoh | 365/51 |

OTHER PUBLICATIONS

"Good bits swapped for bad in 64-kilobit E-PROM", Electronics, Mar. 13, 1980, vol. 53, pp. 115-121, by V. G. McKenny.

"Session XII: ROMs, PROMs and EROMs—THPM 12.3: A 5V 64K EPROM utilizing Predundant Circuitry", IEEE Int. Solid-State Circuits Conference, Feb. 1980, pp. 146-147, 270, by V. G. McKenny.

Primary Examiner—Joseph A. Popek
Attorney, Agent, or Firm—Hill, Steadman & Simpson

[57] ABSTRACT

In a semiconductor memory having word lines and power source lines such as bit lines, two word lines extending on both sides of each contact hole of one of the power source lines extending adjacent to each other extend between two adjacent contact holes of the other power source line, which are staggered from the contact hole of the one power source line. A peripheral circuit of the semiconductor memory can be simplified although the memory is suitable for high-speed operation and high integration.

6 Claims, 2 Drawing Sheets ns of the second layer on the semiconductor substrate or Al film extend parallel to each other, obliquely with respect to the active regions 11, and perpendicularly to the word lines 12. In the first embodiment, of two power source lines 13, one power source line serves as a bit line, i.e., the Vcc line, and the other power source line serves as a common line, i.e., the Vss line.

SEMICONDUCTOR MEMORY

BACKGROUND OF THE INVENTION

1. Field of the Invention

The present invention relates to a semiconductor memory having word lines and power source lines such as bit lines.

2. Description of the Prior Art

FIG. 1 is a conventional mask ROM invented by the present inventor. In this mask ROM, a plurality of stripe-like active regions 11 extend parallel to each other in a semiconductor substrate, and a plurality of stripe-like word lines 12 consisting of a conductive film of the first layer on the semiconductor substrate extend parallel to each other and obliquely with respect to the active regions 11.

A plurality of stripe-like power source lines 13 constituted by a conductive film of the second layer on the semiconductor substrate are formed parallel to each other and extend obliquely with respect to the active regions 11. Of the two power source lines 13 adjacent to each other, when one power source line serves as a bit line, i.e., the Vcc line, the other power source line serves as a common line, i.e., the Vss line.

Contact holes 14 are formed at intersections between the active regions 11 and the power source lines 13. In this case, the positional relationship between the active regions 11 and the power source lines 13 is determined so that the contact holes 14 are staggered in the adjacent power source lines 13.

A half of the bit line contact hole 14 and a half of the common line contact hole 14 are present in a unit cell 15. Each contact hole 14 is shared by two unit cells 15 adjacent to each other on the active region 11.

In the mask ROM described above, since the power source lines 13 are not formed by an impurity diffused region in the semiconductor substrate, it is possible to use low-resistance power source lines consisting of a polycide film or the like. Therefore, the mask ROM is suitable for high-speed access.

Since the contact holes 14 are staggered in two adjacent power source lines 13, it is possible to locate the power source lines 13 closer to each other than a structure in which contact holes 14 are adjacent to each other. Therefore, the mask ROM described above is suitable for high integration.

In addition, when an EPROM is formed by the layout shown in FIG. 1, floating gates (not shown) corresponding to two adjacent power source lines 13 are also staggered from each other. Therefore, it is possible to locate the power source lines 13 close to each other. Therefore, this structure is suitable for high integration.

In the layout shown in FIG. 1, although the contact holes 14 are staggered from each other in two adjacent power source lines 13, as described above, the two word lines 12 extending on both sides of each contact hole 14 of one of the power source lines 13 extend on both sides of a corresponding contact hole 14 of the other power source line 13.

For this reason, the word lines 12 and the power source lines 13 inevitably extend obliquely to each other. As a result, whole cell array has a shape of parallelogram. When the cell array of a parallelogram is cut and is bonded to form a rectangular shape for application convenience, peripheral circuits such as a decoder and wiring patterns are undesirably complicated.

OBJECT AND SUMMARY OF THE INVENTION

It is an object of the present invention to provide a semiconductor memory which is suitable for high-speed access due to capability of use of low-resistance power source lines and for high integration due to capability of locating power source lines close to each other, and wherein peripheral circuits are simple due to capability of forming word lines and power source lines perpendicular to each other.

In a semiconductor memory according to the present invention, since power source lines 13 are not formed by an impurity diffused region in a semiconductor substrate, low-resistance power source lines 13 can be used.

As contact holes in two adjacent power source lines are staggered from each other, the power source lines are located closer to each other than a structure in which the contact holes are formed adjacent to each other.

As floating gates corresponding to two adjacent power source lines are staggered from each other, the power source lines can be located closer to each other.

As the two word lines extending on both sides of each contact hole of one of two adjacent power source lines extend between two adjacent contact holes of the other power source line, which are staggered from the contact hole of the one power source line, the word lines are formed to be perpendicular to the power source lines.

DETAILED DESCRIPTION OF THE PREFERRED EMBODIMENTS

The first and second embodiments of the present invention will be described in detail with reference to FIGS. 2 and 3, respectively.

Figure 2:
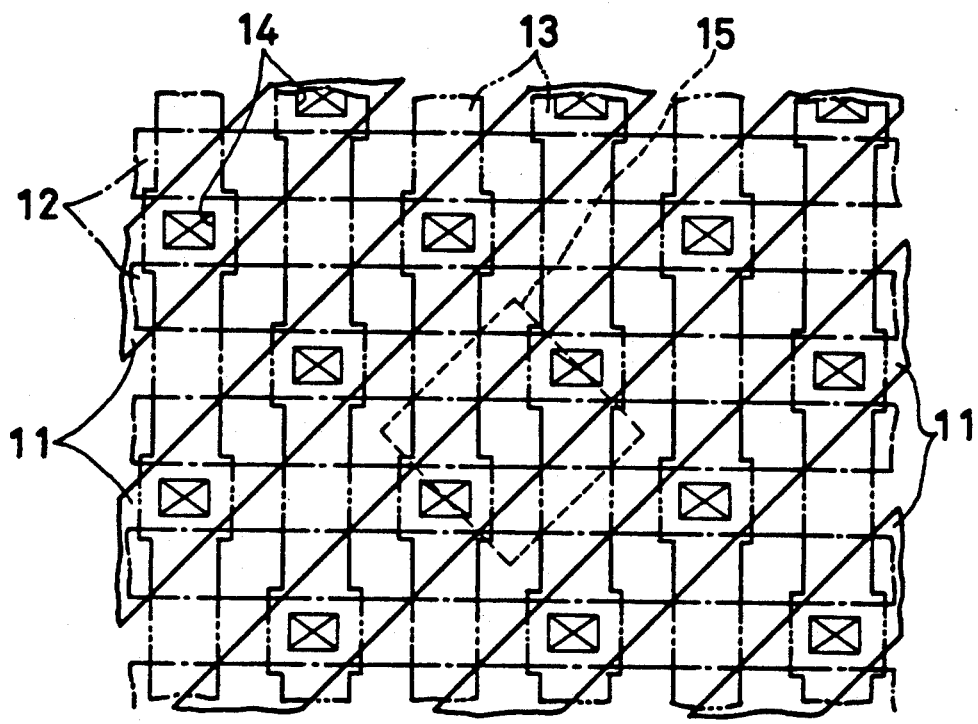
FIGS. 2 and 3 are plan views showing semiconductor memories according to the first and second embodiments of the present invention, respectively.

FIG. 2 shows the first embodiment which exemplifies a mask ROM. In the first embodiment, a plurality of stripe-like active regions 11 extend parallel to each other in a semiconductor substrate. A plurality of stripe-like word lines 12 consisting of a poly-Si film of the first layer on the semiconductor substrate extend parallel to each other and obliquely with respect to the active regions 11.

A plurality of stripe-like power source lines 13 consisting of a poly-Si film of the second layer on the semiconductor substrate or Al film extend parallel to each other, obliquely with respect to the active regions 11, and perpendicularly to the word lines 12. In the first embodiment, of two power source lines 13, one power source line serves as a bit line, i.e., the Vcc line, and the other power source line serves as a common line, i.e., the Vss line.

Contact holes 14 are formed at intersections between the active regions 11 and the power source lines 13. In this case, the contact holes 14 in two adjacent power source lines 13 are staggered from each other. A positional relationship between the active regions 11, the word lines 12, and the power source lines 13 is determined so that the two word lines 12 extending on both sides of each contact hole 14 of one of the power source lines 13 extend between two adjacent contact holes 14 formed in the other power source line 13, which are staggered from the contact hole 14 of the one power source line 13.

In the first embodiment, a half of the bit line contact hole 14 and a half of the common line contact hole 14 are located within each unit cell 15. One contact hole 14 is shared by two adjacent unit cells 15 on the active region 11.

In the first embodiment having the above positional relationship between the active regions 11, the word lines 12, and the power source lines 13, as is also apparent from FIG. 2, the word lines 12 can be perpendicular to the power source lines 13.

Figure 1:
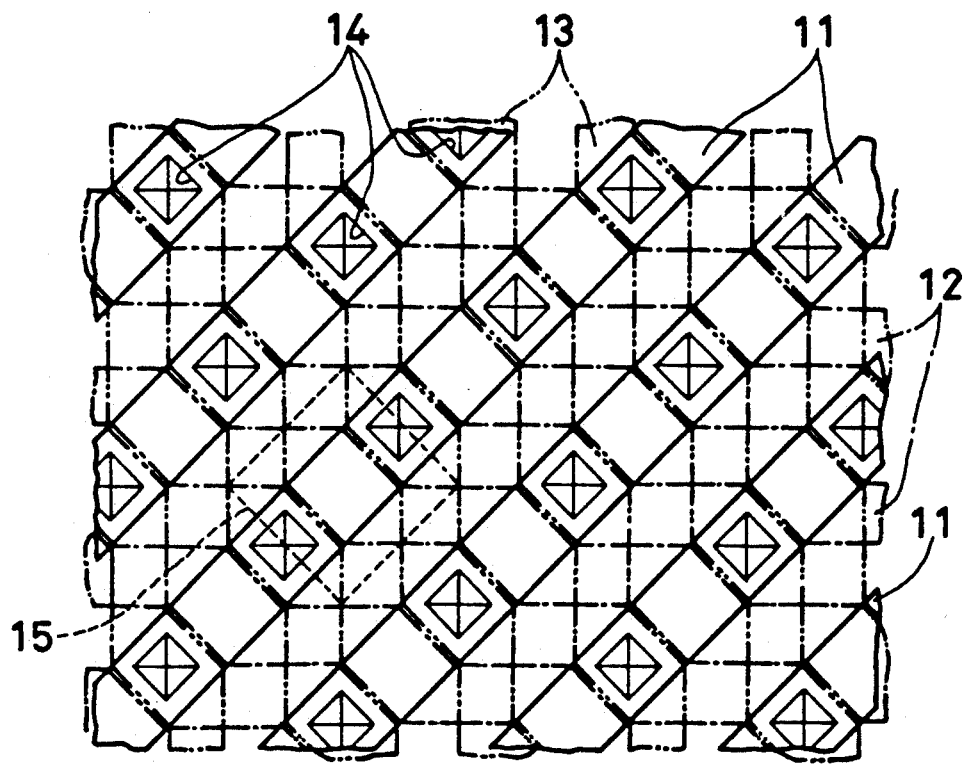
FIG. 1 is a plan view showing a conventional mask ROM invented by the present inventor.

The cell array can have a rectangular shape. Cutting and bonding as in those of the conventional mask ROM in FIG. 1 need not be performed. Peripheral circuits such as a decoder and wiring patterns can be simplified in the first embodiment.

Figure 3:
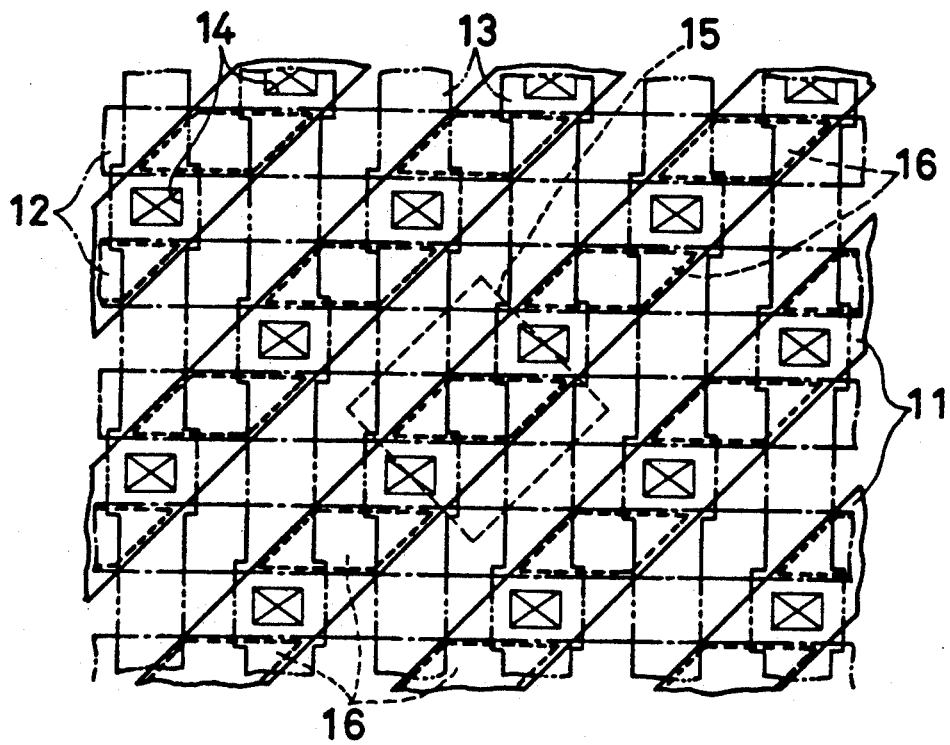

FIG. 3 shows the second embodiment exemplifying an EPROM. In the second embodiment, floating gates 16 made of a poly-Si film or the like of the first layer on a semiconductor substrate are formed in intersection regions of parallelograms between active regions 11 and word lines 12.

Word lines 12, i.e., control gates, are formed of a poly-Si layer or the like of the second layer on the semiconductor substrate, and power source lines 13 are made of a poly-Si film of the third layer on the semiconductor substrate or Al film. Therefore, a planar layout of the second embodiment is the same as that of the first embodiment.

What is claimed is:

1. A semiconductor memory wherein contact holes which connect active regions of a semiconductor substrate and power source lines on said semiconductor substrate are staggered from each other in two adjacent power source lines, and two word lines extending on both sides of each contact hole of one of said two adjacent power source lines extend between two adjacent contact holes of the other power source line, which are staggered from the contact hole of the one power source line.

2. A memory according to claim 1, wherein said word lines are linear.

3. A memory according to claim 2, wherein a plurality of said word line pairs extend parallel to each other and obliquely with respect to said active regions.

4. A memory according to claim 3, wherein said power source lines are linear.

5. A memory according to claim 4, wherein a plurality of said power source line pairs are parallel to each other, oblique with respect to said active regions and perpendicular to said word lines.

6. A memory according to any one of claims 1 to 5, wherein an intermediate layer between said active region and said word line at an intersection between said active region and said word line constitutes a floating gate.

* * * * *